United States Patent
Kanai

(10) Patent No.: US 10,939,583 B2
(45) Date of Patent: Mar. 2, 2021

(54) ELECTRONIC COMPONENT COOLING MODULE AND ELECTRONIC APPARATUS

(71) Applicant: FUJITSU LIMITED, Kawasaki (JP)

(72) Inventor: Yuki Kanai, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/829,067

(22) Filed: Mar. 25, 2020

(65) Prior Publication Data

US 2020/0337182 A1  Oct. 22, 2020

(30) Foreign Application Priority Data

Apr. 22, 2019  (JP) .............................. JP2019-080806

(51) Int. Cl.
  *H05K 7/20*  (2006.01)
  *H01L 23/473*  (2006.01)

(52) U.S. Cl.
  CPC ....... *H05K 7/20272* (2013.01); *H01L 23/473* (2013.01); *H05K 7/20263* (2013.01); *H05K 7/20772* (2013.01); *G06F 2200/201* (2013.01)

(58) Field of Classification Search
  CPC .......... H05K 7/20254–20272; H05K 7/20636; H05K 7/20772; H01L 23/433–4332; H01L 23/473
  See application file for complete search history.

(56) References Cited

U.S. PATENT DOCUMENTS

| 6,216,771 | B1* | 4/2001 | Holmberg | H01L 23/473 165/104.33 |
| 7,286,355 | B2* | 10/2007 | Cheon | G06F 1/20 165/104.33 |
| 8,659,897 | B2* | 2/2014 | Meijer | G06F 1/20 361/699 |
| 9,370,122 | B2* | 6/2016 | Chainer | H05K 7/20009 |
| 10,520,259 | B2* | 12/2019 | Chialastri | F28D 15/0208 |
| 10,582,645 | B1* | 3/2020 | Kufahl | H05K 7/20781 |
| 2013/0342987 | A1* | 12/2013 | Yang | H01L 23/40 361/679.32 |
| 2015/0055301 | A1* | 2/2015 | So | H05K 7/20509 361/701 |
| 2020/0344918 | A1* | 10/2020 | Wondimu | G05B 19/042 |

FOREIGN PATENT DOCUMENTS

JP  2013-201165 A  10/2013

* cited by examiner

*Primary Examiner* — Robert J Hoffberg
(74) *Attorney, Agent, or Firm* — Fujitsu Patent Center

(57) ABSTRACT

An electronic component cooling module includes a tube disposed in parallel with an electronic component mounted on a board, in which a coolant liquid that cools the electronic component flows, and configured to include an expansion portion that expands, due to a pressure of the coolant liquid, toward the electronic component disposed beside the tube so as to be brought into surface contact with the electronic component, and a height maintaining portion that maintains a dimension in a height direction, and a supporter configured to support the tube, and a height of the tube and a height of the supporter are equal to or smaller than a height of the electronic component in a state in which the electronic component is mounted on the board.

17 Claims, 14 Drawing Sheets

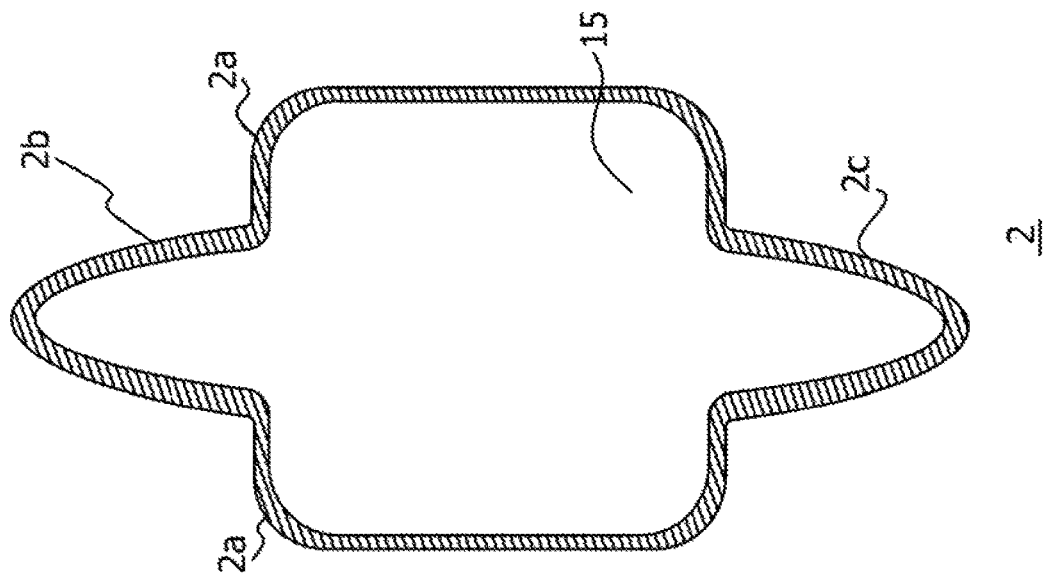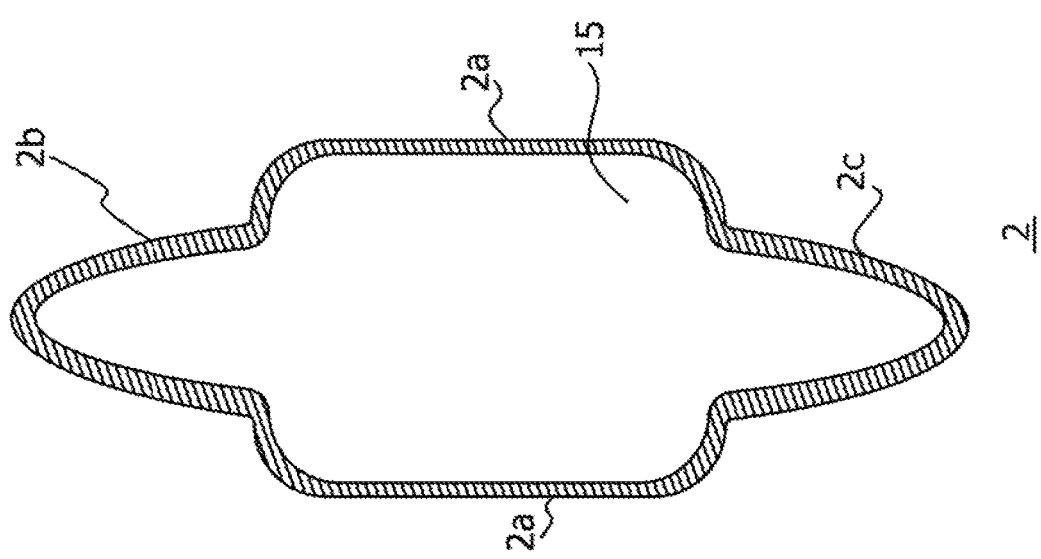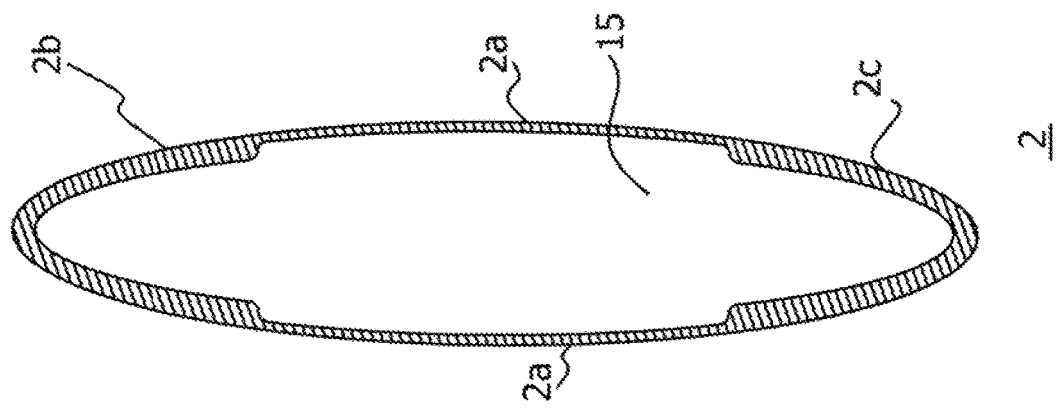

P1 > P2

ELECTRONIC COMPONENT COOLING MODULE AND ELECTRONIC APPARATUS

CROSS-REFERENCE TO RELATED APPLICATION

This application is based upon and claims the benefit of priority of the prior Japanese Patent Application No. 2019-80806, filed on Apr. 22, 2019, the entire contents of which are incorporated herein by reference.

FIELD

The embodiment discussed herein is related to an electronic component cooling module and an electronic apparatus.

BACKGROUND

Nowadays, for example, an increase in the amount of communication between electronic components such as memories, an increase in the communication speed, and further, free cooling for data centers cause an increase in temperatures of installation environments of electronic apparatuses such as servers. In some cases, air channels for cooling are not sufficiently ensured due to high-density mounting of electronic components. Under such circumstances, cooling of electronic components may be insufficient even when forced air cooling is performed with system fans, Thus, known cooling devices for an electronic device employ a cooling method in which heat is received by a coolant liquid (related art is disclosed in, for example, Japanese Laid-open Patent Publication No. 2013-201165). Japanese Laid-open Patent Publication No. 2013-201165 discloses a cooling device. The cooling device includes a structure that has a gap in which the electronic device is held and that allows a coolant liquid to flow through the structure. This cooling device cools the electronic device by ensuring a contact pressure between the structure and the electronic device held in the gap the width of which reduces due to stretching of the structure.

SUMMARY

According to an aspect of the embodiments, an electronic component cooling module includes a tube disposed in parallel with an electronic component mounted over a board, in which a coolant liquid that cools the electronic component flows, and configured to include an expansion portion that expands, due to a pressure of the coolant liquid, toward the electronic component disposed beside the tube so as to be brought into surface contact with the electronic component, and a height maintaining portion that maintains a dimension in a height direction, and a supporter configured to support the tube, and wherein a height of the tube and a height of the supporter are equal to or smaller than a height of the electronic component in a state in which the electronic component is mounted over the board.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7A is a sectional view of the tube in a state in which the tube has not expanded, FIG. 7B is a sectional view of the tube in a state in which the expansion amount is small, and FIG. 7C is a sectional view of the tube in a state in which the expansion amount is great;

DESCRIPTION OF EMBODIMENTS

Figure 1:
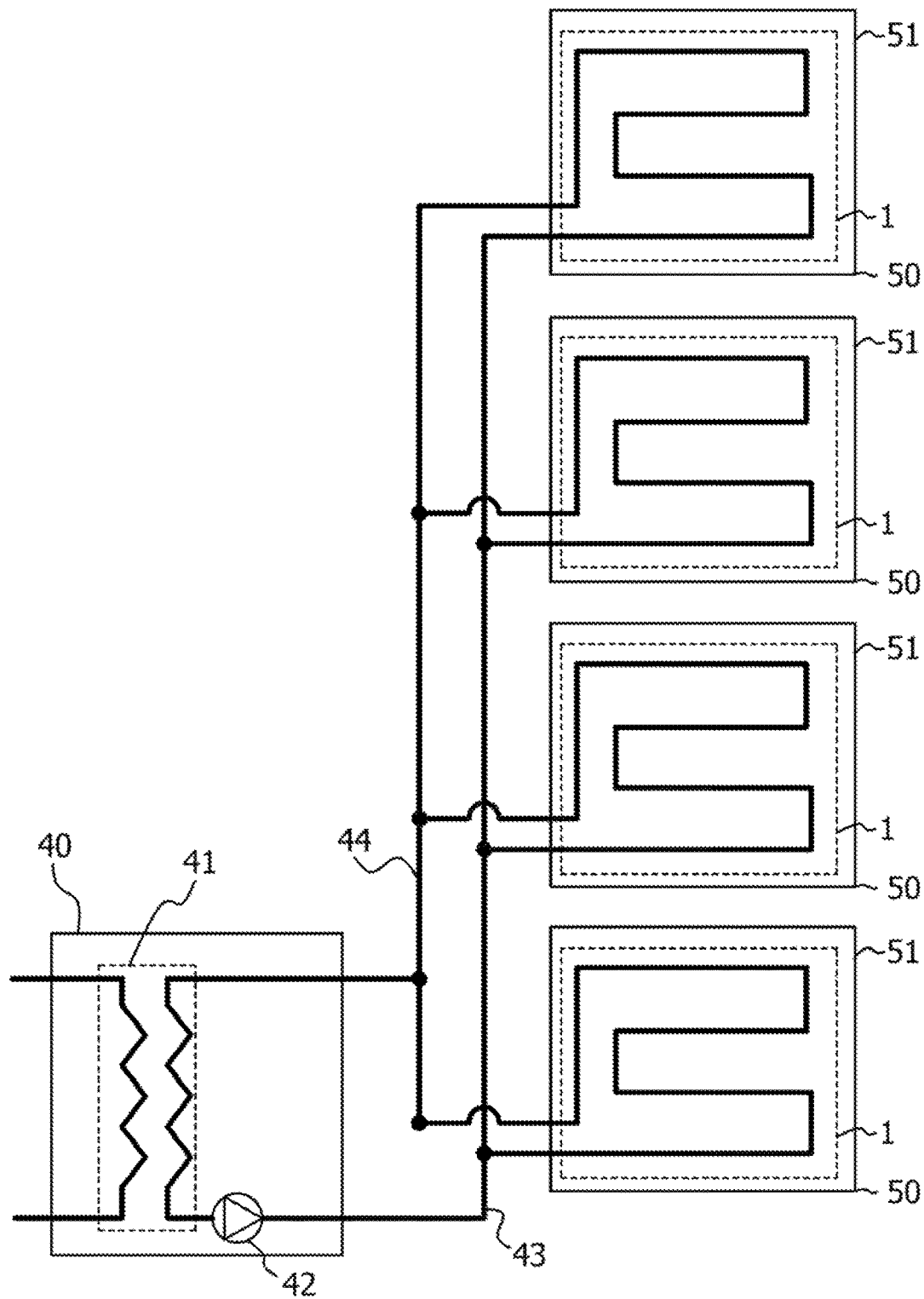
FIG. 1 is a schematic configuration view of an electronic apparatus according to an embodiment.

When a cooling module that cools an electronic component and is incorporated in an electronic apparatus is installed such that part of the cooling module exists in a region higher than the electronic component, high-density mounting of the electronic apparatus is hindered. For example, it is assumed that a memory that is an electronic component is inserted into a memory slot provided over a motherboard. In this case, when part of the cooling module is located above an end edge of the memory on the side far from the motherboard, the high-density mounting is influenced. Thus, not to influence the high-density mounting of the electronic apparatus, preferably, the cooling module does not exist in a region higher than the electronic component incorporated in the electronic apparatus. However, in a form described in Japanese Laid-open Patent Publication No. 2013-201165, an electronic device is held in a gap of a structure, and part of the structure exists in a region higher than the electronic device.

Hereinafter, an embodiment of a technique will be described with reference to the accompanying drawings. With this technique, an electronic component is able to be cooled by a coolant liquid in a region not higher than the electronic component. In the drawings, the dimensions, ratios, and the like of parts are not necessarily illustrated to be completely consistent with those of the actual parts. In some drawings, for convenience of description, elements actually present may be omitted or the dimensions may be illustrated in an exaggerated manner compared to the actual dimensions.

EMBODIMENT

First, an electronic apparatus 100 according to an embodiment is described with reference to FIGS. 1 to 9B. Referring to FIG. 1, the electronic apparatus 100 includes a plurality of servers (nodes) 50, The servers 50 are provided with respective electronic component cooling modules (hereinafter simply referred to as "cooling modules") 1. Each cooling module 1 is coupled to a coolant distribution unit (CDU) 40 through a first pipe 43 and a second pipe 44. The CDU 40 includes a heat exchanger 41 and a pump 42. The pump 42 circulates a coolant liquid 15 (see FIG. 6) enclosed in the first pipe 43, the cooling modules 1, and the second pipe 44. The heat exchanger 41 exchanges heat between the coolant liquid 15 and a coolant that has been cooled outside of the CDU 40 and flows into the CDU 40 so as to cool the coolant liquid 15. The first pipe 43 distributes the coolant liquid 15 cooled by the heat exchanger 41 to each cooling module 1. The second pipe 44 recovers the coolant liquid 15 that has deprived the servers 50 of heat in the cooling modules 1 and has been heated, Although four servers 50 are illustrated in FIG. 1, the number of servers 50 is not limited to this. In the description of the present embodiment, a configuration that includes the plurality of servers 50 is referred to as the electronic apparatus for convenience of description. Alternatively, each one of the servers 50 may be referred to as the electronic apparatus.

Figure 2:
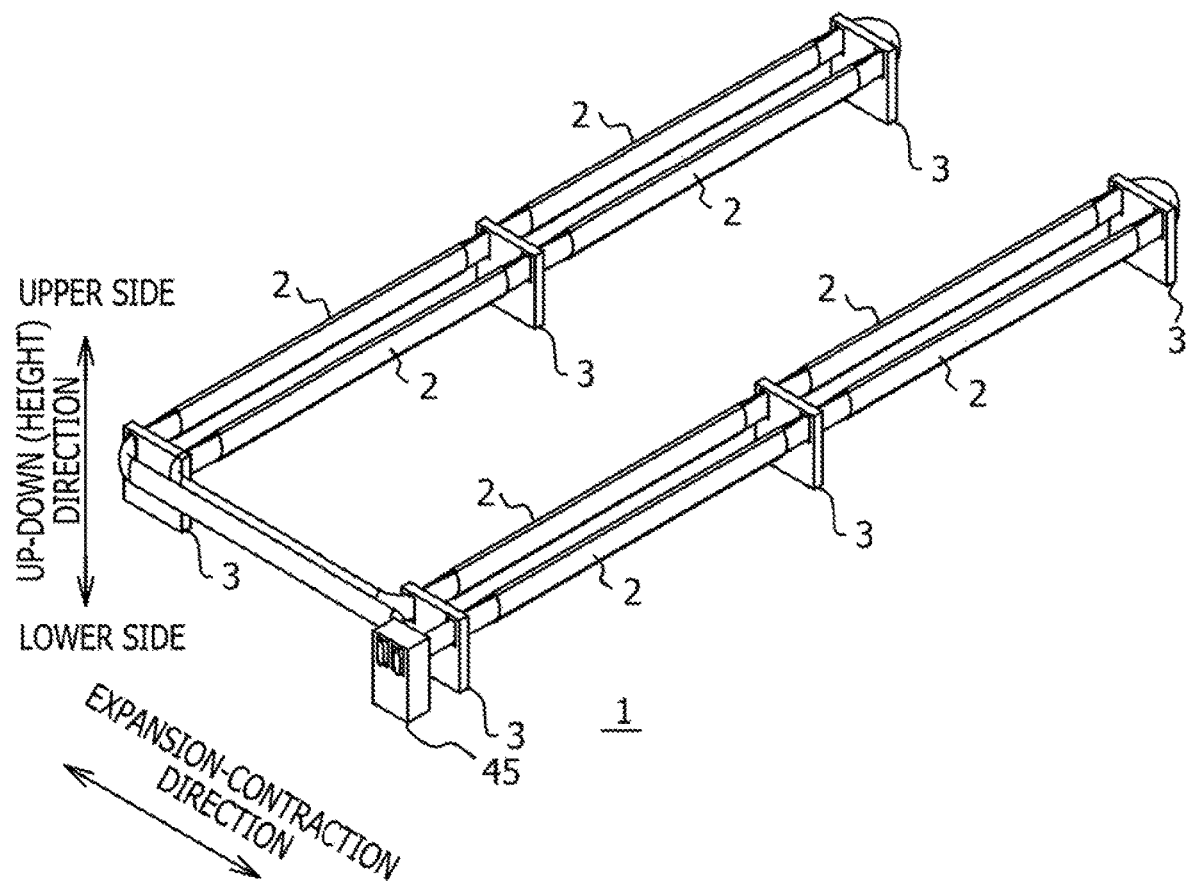
FIG. 2 is a perspective view of an electronic component cooling module according to the embodiment.

Referring to FIG. 2, the cooling module 1 includes a plurality of tubes 2 and support portions 3 that support the tubes 2. The plurality of tubes 2 are arranged in series. A pressure adjustment tank 45 is provided in a portion where an inlet portion and an outlet portion of the tubes 2 arranged in series are disposed. The pressure adjustment tank 45 is provided so that the pressure in the tubes 2 due to the coolant liquid 15 does not exceed a predetermined value. The pressure adjustment tank 45 may have a coupler shape. When the pressure adjustment tank 45 has a coupler shape, the cooling module 1 may be easily attached and removed, and operation for draining the coolant liquid 15 from the cooling module 1 may be facilitated. An accumulator may be provided instead of the pressure adjustment tank 45.

Figure 3:
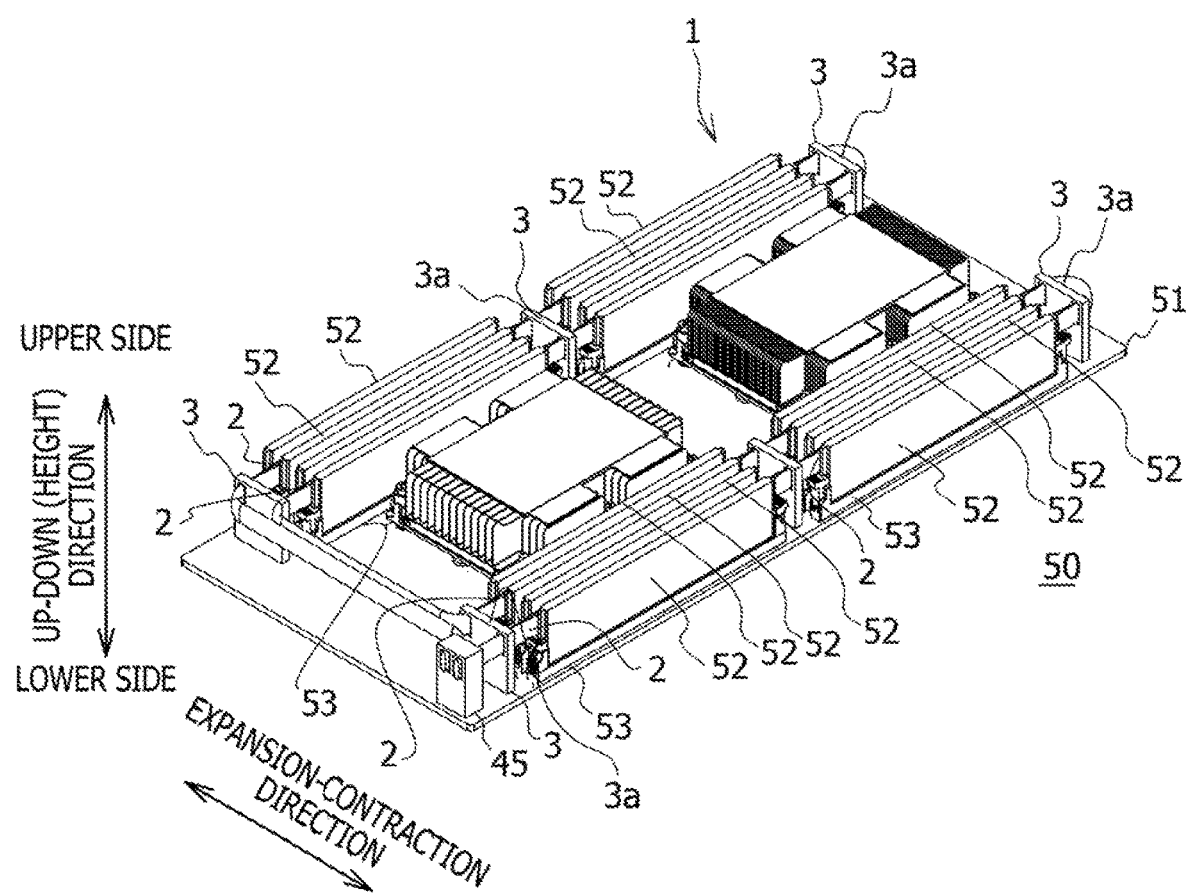
FIG. 3 is a perspective view of a server included in the electronic apparatus according to the embodiment.
Figure 4:
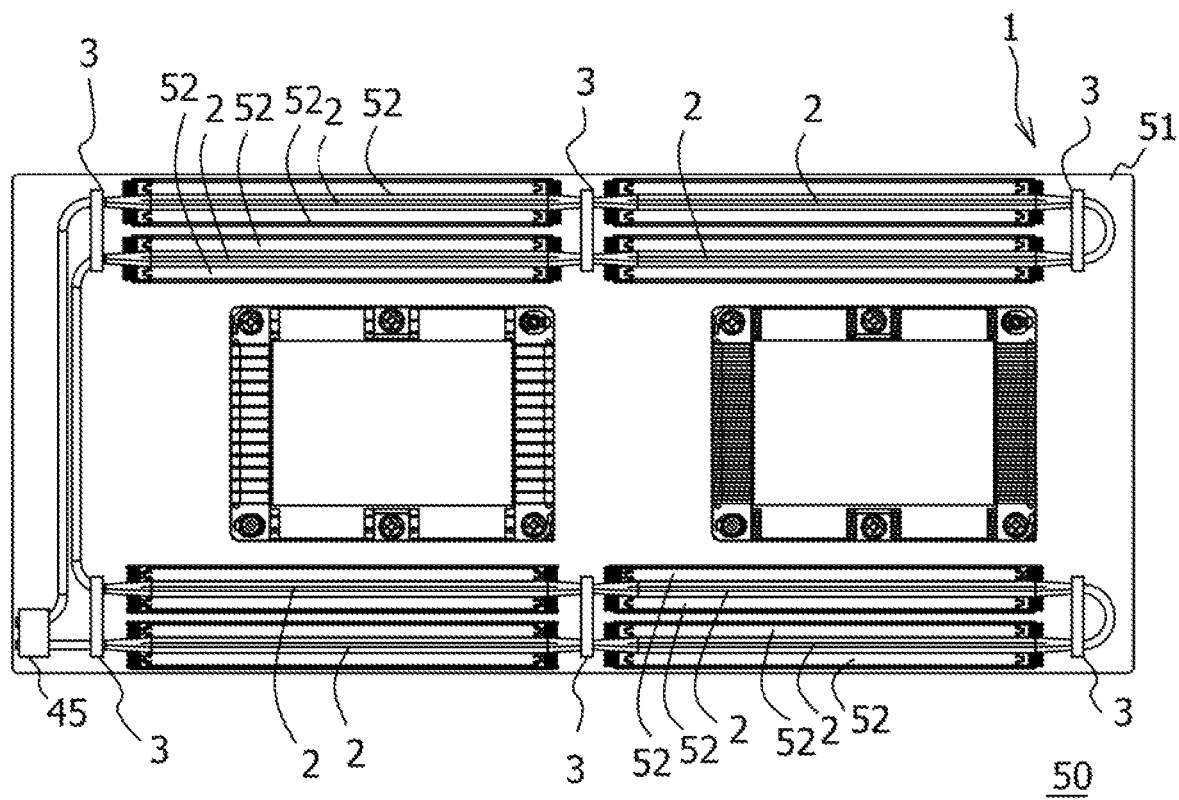
FIG. 4 is a plan view of the server included in the electronic apparatus according to the embodiment.

Referring to FIGS. 3 and 4, each server 50 includes memory slots 53 and memories 52. The memory slots 53 are disposed over a motherboard (board) 51, and the memories 52 as electronic components are inserted into the memory slots 53. The memories 52 according to the present embodiment are arranged in two rows in the longitudinal direction and eight rows in the thickness direction. Thus, a total of 16 memories 52 are mounted over the motherboard. With respect to such arrangement of the memories 52, the tubes 2 are disposed in the longitudinal direction of the memories 52. The tubes 2 are supported by the support portions 3 secured to the motherboard 51 on the motherboard 51. The tubes 2 are arranged so as to pass through spaces between the memories 52 that face each other and so as to be parallel to the memories 52. Although each memory 52 serves as an example of the electronic component to be cooled, the electronic component to be cooled is not limited to the memory 52.

When the motherboard 51 itself is mounted in a server rack or the like, the motherboard 51 may be installed such that a smooth surface of the motherboard 51 is horizontally or vertically oriented. In the following description, for convenience of explanation, as illustrated in FIG. 3, a direction perpendicular to the smooth surface of the motherboard 51 is referred to as an up-down direction or a height direction, and the direction in which the memories 52 are arranged so as to face each other is referred to as an expansion-contraction direction in which the tubes 2 expand and contract. Accordingly, the memories 52 are mounted on the motherboard 51 in a position in which the memories 52 stand in the up-down direction, and upper end edges denoted by reference sign 3a in FIG. 3 are at the highest position.

Figure 5:
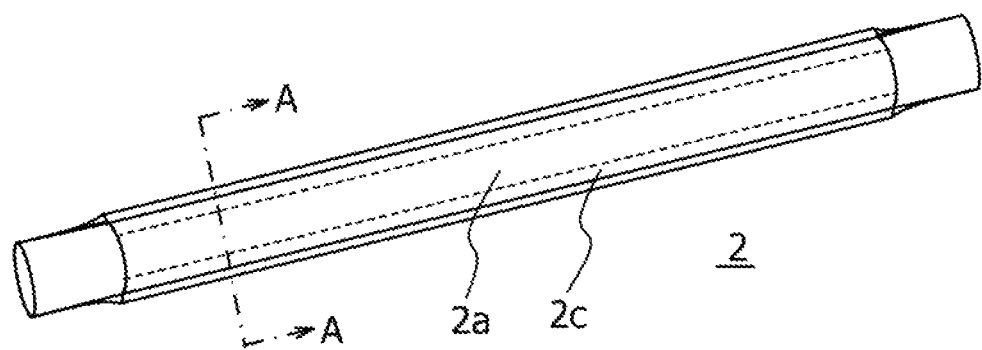
FIG. 5 is a perspective view of a tube included in the electronic component cooling module according to the embodiment.
Figure 6:
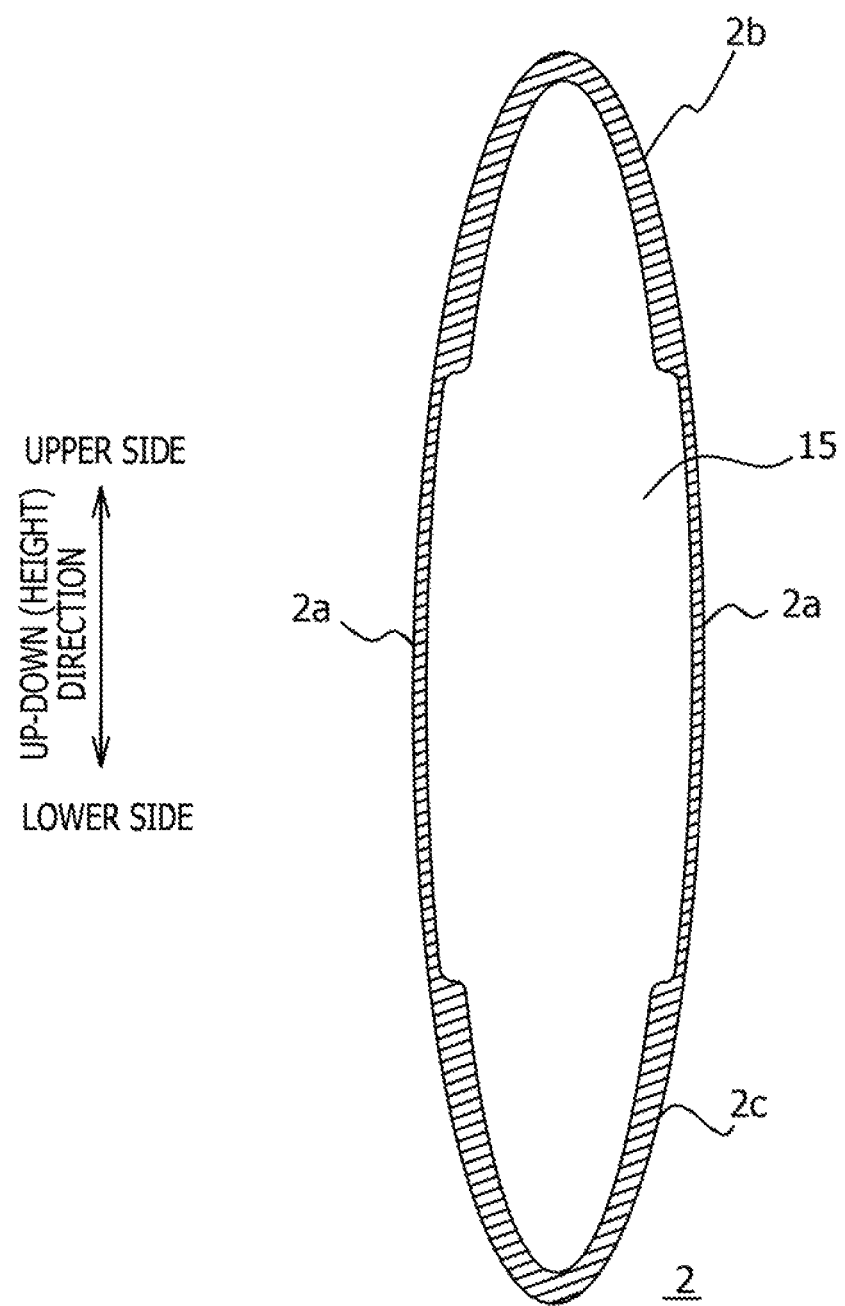
FIG. 6 is a sectional view of the tube included in the electronic component cooling module according to the embodiment taken along line A-A illustrated in FIG. 5.

Referring to FIGS. 5 and 6, each tube 2 allows the coolant liquid 15 to flow through the tube 2 and includes expansion portions 2a and height maintaining portions 2b, 2c that maintain the dimension in the height direction. The height maintaining portions 2b are provided above the expansion portions 2a. The expansion portions 2a are provided so as to face the memories 52 located beside the expansion portions 2a when the tube 2 is incorporated in the server 50. When the coolant liquid 15 flows through the tube 2, the expansion portions 2a are able to expand or contract in response to the pressure of the coolant liquid 15. The expansion portions 2a are able to be brought into contact with the memories 52 disposed beside the expansion portions 2a when the expansion portions 2a expand. When the pressure in the tube 2 is appropriately adjusted, the expansion portions 2a are able to be brought into surface contact with the memories 52. This allows heat transfer between the expansion portions 2a and the memories 52. The coolant liquid 15 deprives the memories 52 of the heat. As a result, the memories 52 are cooled. The coolant liquid 15 having deprived the memories 52 of the heat is cooled by the CD 40 and is sent to the cooling module 1 again by the pump 42. A front end and a rear end of the tube 2 serve as piping portions and are able to be coupled to the other tubes 2 or piping members. Although the tubes 2 are used by coupling the plurality of tubes 2 to each other according to the present embodiment, the entirety of the tubes used for the cooling module 1 may be integrally formed as a single tube.

The tube 2 is formed of a thermally conductive material. The tube 2 according to the present embodiment is formed of silicone rubber, which is a material having elasticity, so that the expansion portions 2a easily expand. It is sufficient that the tube 2 have thermal conductivity and be elastically deformable. For example, other than silicone rubber, the tube 2 may be formed of ethylene propylene rubber. Examples of a known material of related art able to be appropriately employed as the material of the tube 2 include polysulfide rubber, nitrile rubber, norbornene rubber, hydrogenated nitrile rubber, acrylic rubber, fluorine rubber, silicone rubber, urethane rubber, ethylene propylene rubber, styrene butadiene rubber, chloroprene rubber, chlorosulfonated polyethylene, epichlorohydrin rubber, natural rubber, isoprene rubber, butadiene rubber, and so forth. In order to improve the heat transfer property of the tubes, a filler such as copper or aluminum having a good thermal conductivity may be added to the rubber material.

The thickness of the expansion portions 2a and the height maintaining portions 2b, 2c is described. According to the present embodiment, the expansion portions 2a and the height maintaining portions 2b, 2c are integrally formed, and the thickness of the expansion portions 2a is smaller than the thickness of the height maintaining portions 2b, 2c This facilitates deformation of the expansion portions 2a compared to the height maintaining portions 2b, 2c. Thus, when the pressure in the tube 2 increases, the tube 2 is able to expand sideways so as to be brought into surface contact with the memories 52. In contrast, in a state in which the tube 2 is supported by the support portions 3, the positions of the height maintaining portions 2b, 2c are substantially unchanged in the height direction.

The tube 2 according to the present embodiment includes the expansion portions 2a provided in respective wall surfaces that face each other. However, the expansion portion 2a may be provided in only one of the side walls of the tube 2. For example, in a layout in which the memory 52 is disposed beside only one side of the tube 2, the expansion portion 2a may be provided on the side beside which the memory 52 is disposed.

The expansion portions 2a are able to be brought into close contact with the memories 52 when the pressure in the tube 2 increases. Thus, a good thermal conductivity may be realized. Accordingly, components such as a thermal sheet provided in a cooling device of related art are not necessarily used. Since the tube 2 is brought into direct contact with the memories, a heat spreader or the like are not necessarily used. This may reduce the cost of the device.

The tube 2 according to the present embodiment has an elliptical shape in section, and the expansion portions 2a are provided in the side walls having a small curvature. This allows the expansion portions 2a to be brought into contact with the memories 52 in large regions. Thus, the thermal conductivity may be improved, and accordingly, cooling efficiency may be improved.

Although pure water is used as the coolant liquid 15 according to the present embodiment, the coolant liquid 15 is not limited to this. Any known coolant employed as a coolant for liquid cooling devices of related art such as an ethylene glycol aqueous solution is able to be employed as the coolant liquid 15 according to the present embodiment.

The degree of expansion of the expansion portions 2a of the tube 2 is adjustable as illustrated in FIGS. 7A to 7C by adjusting output of the pump 42. When the pump 42 is not operated, the expansion portions 2a contract as illustrated in FIG. 7A. When the output of the pump 42 is adjusted to an intermediate degree, the expansion portions 2a slightly expand as illustrated in FIG. 7B. When the output of the pump 42 is further increased, the expansion portions 2a greatly expand as illustrated in FIG. 7C When the expansion portions 2a greatly expand, the degree of close contact with the memories 52 may be improved. For example, the close contact between the tube 2 and the memories 52 may be realized without, for example, a spring or a pressure applying mechanism having a complicated structure.

Figure 8:
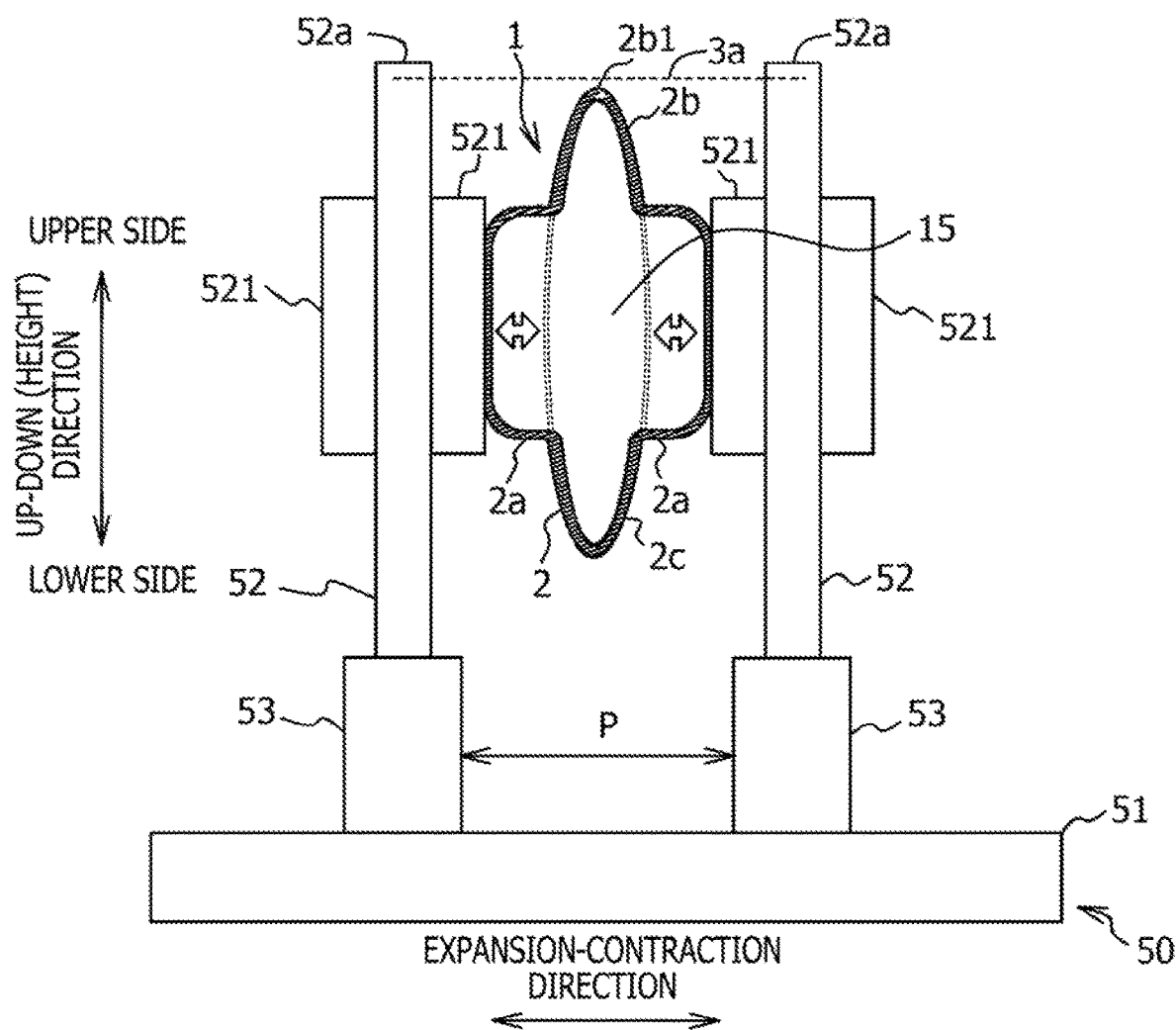
FIG. 8 is an explanatory view schematically illustrating a state in which the tube has expanded and is in contact with electronic components.

Next, with reference to FIG. 8, installation of the tube 2 is described in more detail. Referring to FIG. 8, the tube 2 is disposed between the memories 52 for which the pitch of the memory slots 53 is P. The coolant liquid 15 is fed to the tube 2 so as to expand the expansion portions 2a to such a degree that the expansion portions 2a are pressed against mounted components (chips) 521 included in the memories 52. The flow rate of the coolant liquid 15 for determining the pressure in the tube 2 is determined by adjusting the output of the pump 42 in advance.

The tube 2 is installed such that an upper end portion 2b1 of the tube 2 is located at a position lower than upper end portions 52a of the memories 52, for example, located closer to the motherboard 51 than the upper end portions 52a. The support portions 3 are installed such that an upper end portion 3a of the support portions 3 is located at a position lower than the upper end portions 52a of the memories 52, for example, located closer to the motherboard 51 than the upper end portions 52a. When the height of the tubes 2 and the height of the support portions 3 are set to be equal to or smaller than the height of the memories 52 mounted on the motherboard 51 as described above, the cooling module 1 does not necessarily hinder high-density mounting in the electronic apparatus 100.

For example, in each server 50, when the highest position is set at the upper end portions 52a of the memories 52, the height of the server 50 is set based on the memories 52. Thus, the cooling module 1 does not necessarily influence the height of each server 50. As a result, dimensioning of the server 50 may be performed based on the position of the memories 52 in the height direction.

Figure 9A:
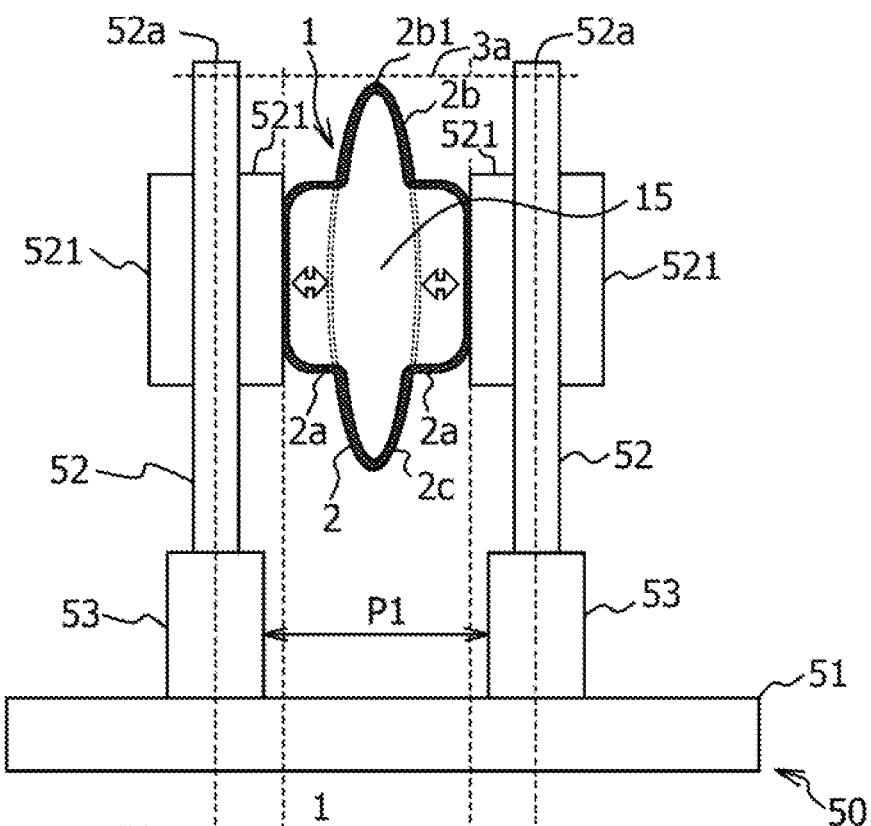
FIG. 9A is an explanatory view schematically illustrating a state in which the tube has expanded and is in contact with electronic components when the pitch of the electronic components is large.
Figure 9B:
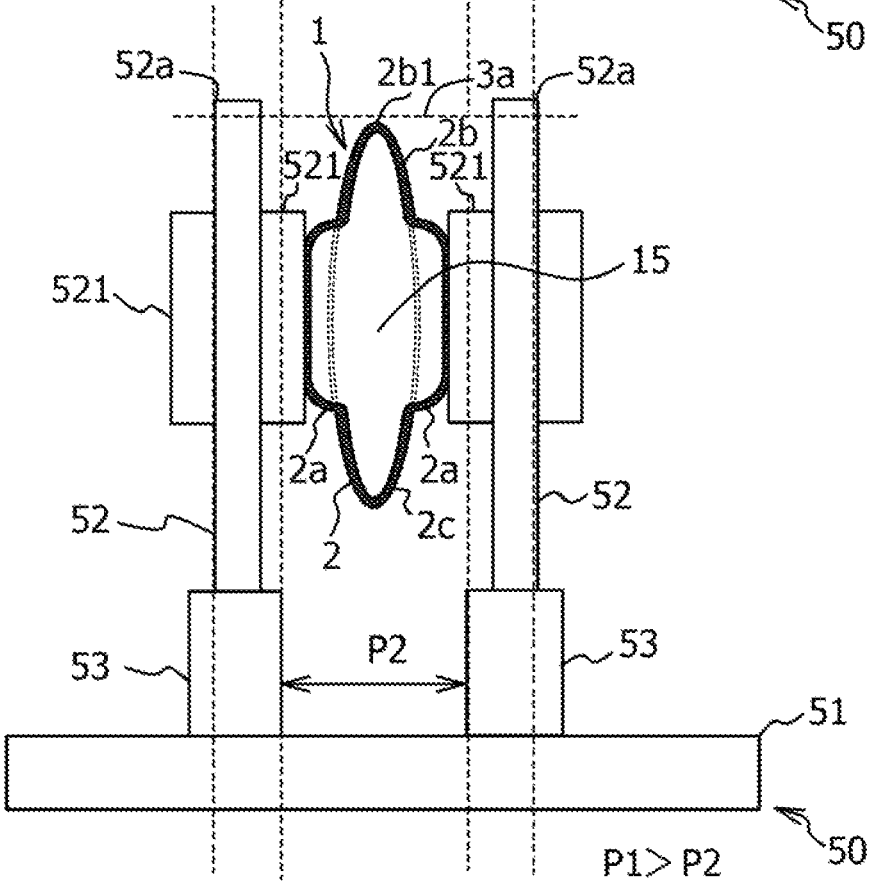
FIG. 9B is an explanatory view schematically illustrating a state in which the tube has expanded and is in contact with the electronic components when the pitch of the electronic components is small.

Next, referring to FIGS. 9A and 9B, how to deal with different pitches P of the memory slots 53 of the tube 2 is described. As described with reference to FIGS. 7A to 7C, the amount of expansion of the expansion portions 2a of the tube 2 is adjustable in response to the pressure in the tube 2. Thus, the tube 2 is able to deal with, for example, the memories 52 disposed at a pitch P1 as illustrated in FIG. 9A and the memories 52 disposed at a pitch P2 smaller than the pitch P1 as illustrated in FIG. 9. For example, with the pitch P1, the expansion amount of the expansion portions 2a is large as illustrated in FIG. 9A, and with the pitch P2, the expansion amount of the expansion portions 2a is small as illustrated in FIG. 9B. Thus, the cooling module 1 according to the present embodiment is able to deal with different layouts of the memories 52.

As described above, the cooling module 1 according to the present embodiment may cool the memories with the coolant liquid 15 in a region not higher than the memories 52. The cooling module 1 may allow the memories 52 to be easily attached and detached by, for example, stopping the pump 42 so as to reduce the pressure in the tubes 2. Thus, efficiency of maintenance work may be improved. A tool may be prepared for draining the coolant liquid 15 from the tube 2. In this case, the pressure in the tube 2 is reduced by draining the coolant liquid 15 with this tool.

First Modification

Figure 10:
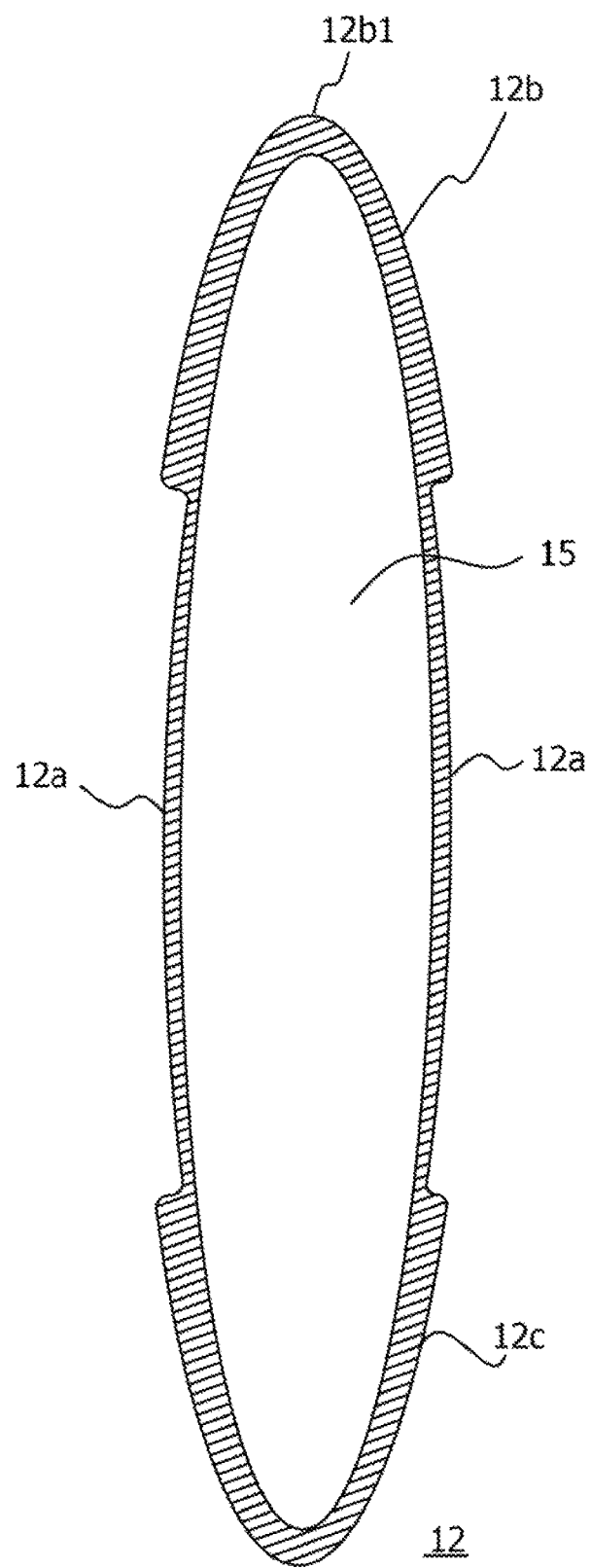
FIG. 10 is a sectional view of a tube according to a modification.

Referring next to FIG. 10, a first modification is described. As illustrated in FIG. 6, in the tube 2 according to the present embodiment, inner peripheral wall surfaces of the tube 2 have a concave shape. Thus, the thickness of the tube 2 is reduced so as to form the expansion portions 2a. In contrast, in a tube 12 according to the first modification, outer peripheral wall surfaces of the tube 12 have a concave shape. Thus, the thickness of the tube 12 is reduced so as to form expansion portions 12a. In the tube 12, thick height maintaining portions 12b are formed above expansion portions 12a and thick height maintaining portions 12c are formed below the expansion portions 12a, This feature is common to the tube 2 and the tube 12, In such a tube 12, the expansion portions 12a are able to appropriately expand so as to be brought into surface contact with the memories 52. The tube 12 as described above is mounted in the server 50 such that an upper end portion 12b1 of the tube 12 is located at a position lower than the upper end portions 52a of the memories 52, Thus, the memories may be cooled by the coolant liquid 15 in a region not higher than the memories 52.

Second Modification

Figure 11:
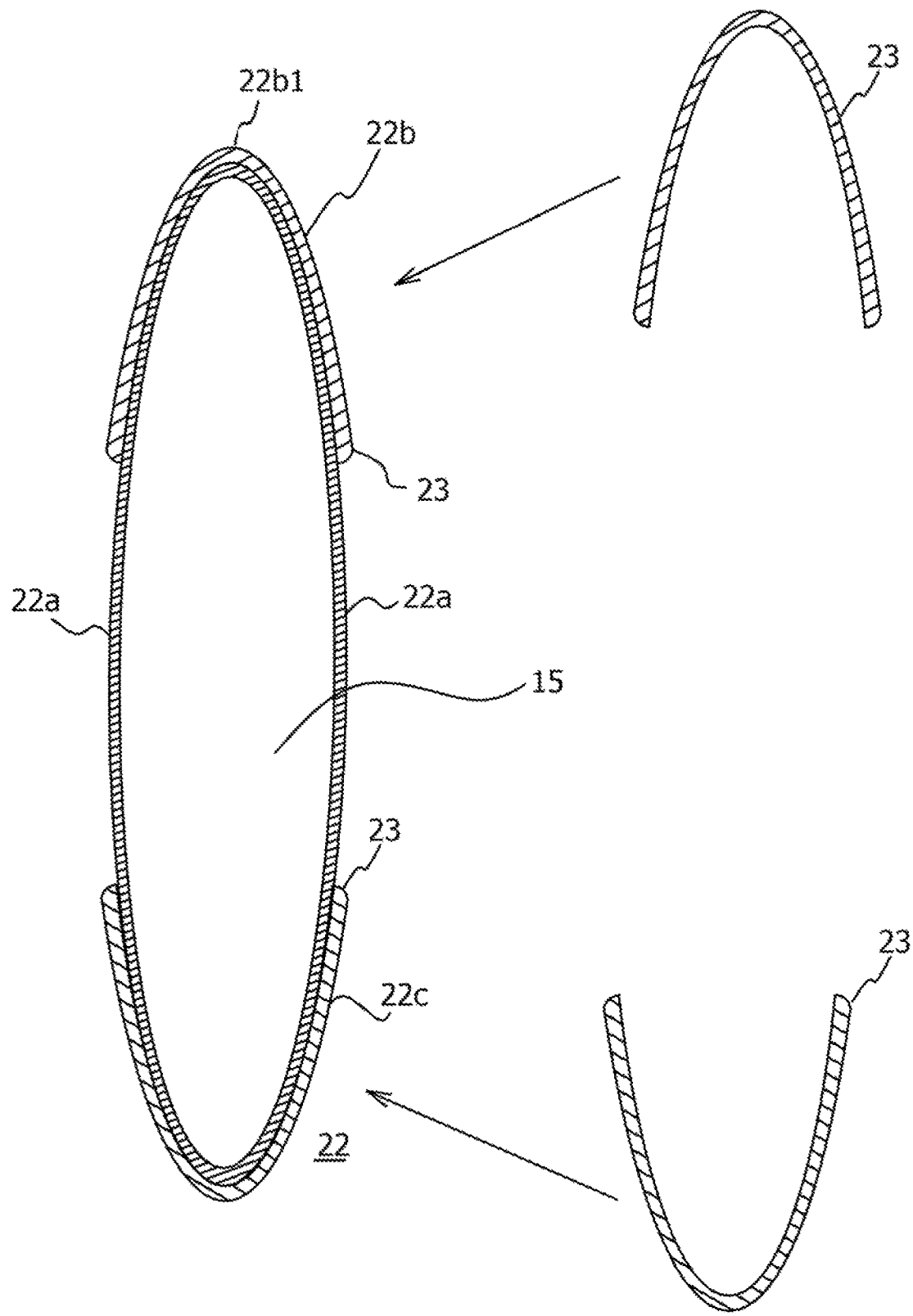
FIG. 11 is a sectional view of a tube according to another modification.

Referring next to FIG. 11, a second modification is described, A tube 22 according to the second modification has a thickness that is uniform over its entire circumference and includes cover members 23 one mounted over an upper end portion and the other mounted over a lower end portion. As a result, portions of the tube 22 between the cover members 23 serve as expansion portions 22a. The portions over which the cover members 23 are mounted respectively form height maintaining portions 22b, 22c. In such a tube 22, the expansion portions 22a are able to appropriately expand so as to be brought into surface contact with the memories 52. The tube 22 as described above is mounted in the server 50 such that an upper end portion 22b1 of the tube 22 is located at a position lower than the upper end portions 52a of the memories 52. Thus, the memories may be cooled by the coolant liquid 15 in a region not higher than the memories 52.

Third Modification

Figure 12:
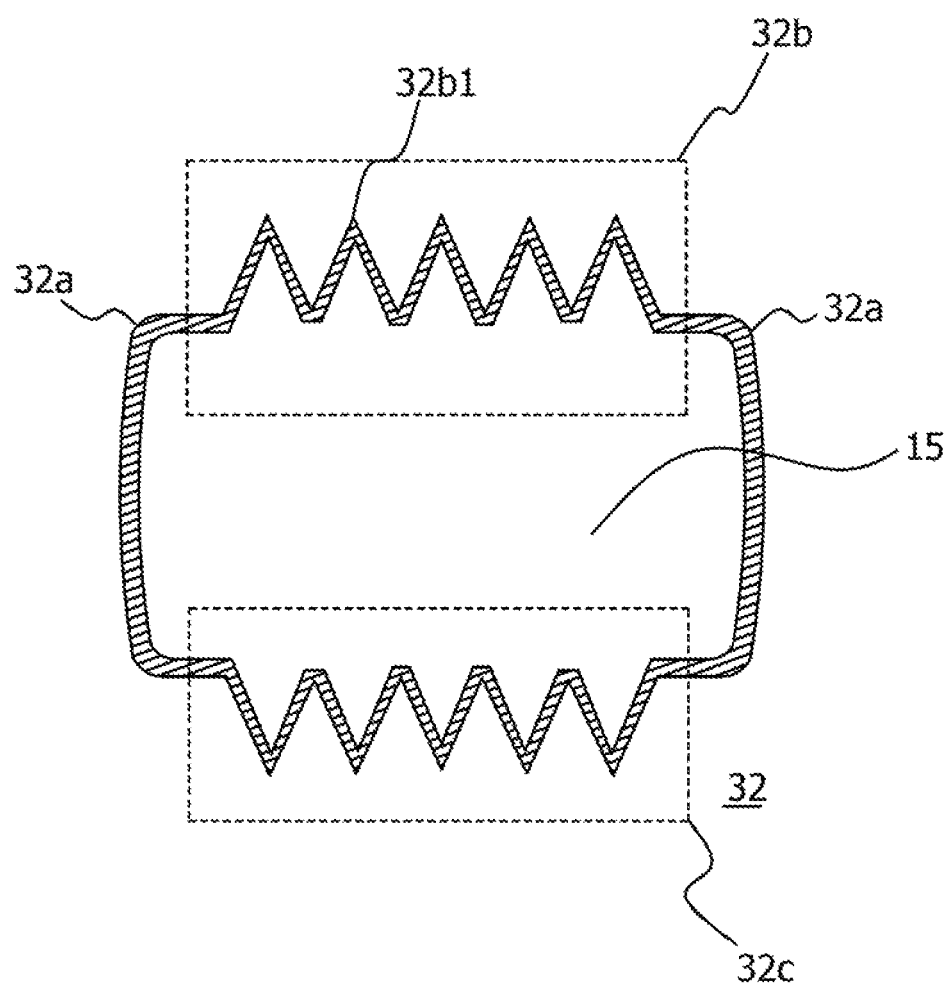
FIG. 12 is a sectional view of a tube according to still another modification.

Referring next to FIG. 12, a third modification is described. A tube 32 according to the third modification includes bellows-shaped portions 32b, 32c that expand and contract in a direction toward the memories 52, and expansion portions 32a are able to approach and be separated from the memories 52 as the bellows-shaped portions 32b, 32c expand and contract. The bellows-shaped portions 32b, 32c expand and contract in the direction toward the memories 52, and the position of the bellows-shaped portions 32b, 32c is substantially unchanged in the height direction. Thus, the bellows-shaped portions 32b and 32c each have a function of a height maintaining portion. The bellows-shaped portions 32b, 32c expand when the pressure in the bellows-shaped portions 32b, 32c increases. As a result, the expansion portions 32a move toward the memories 52 located beside the expansion portions 32a and are brought into surface contact with the memories 52. The tube 32 as described above is mounted in the server 50 such that an upper end portion 32b1 of the tube 32 is located at a position lower than the upper end portions 52a of the memories 52. Thus, the memories may be cooled by the coolant liquid 15 in a region not higher than the memories 52.

Fourth Modification

Figure 13A:
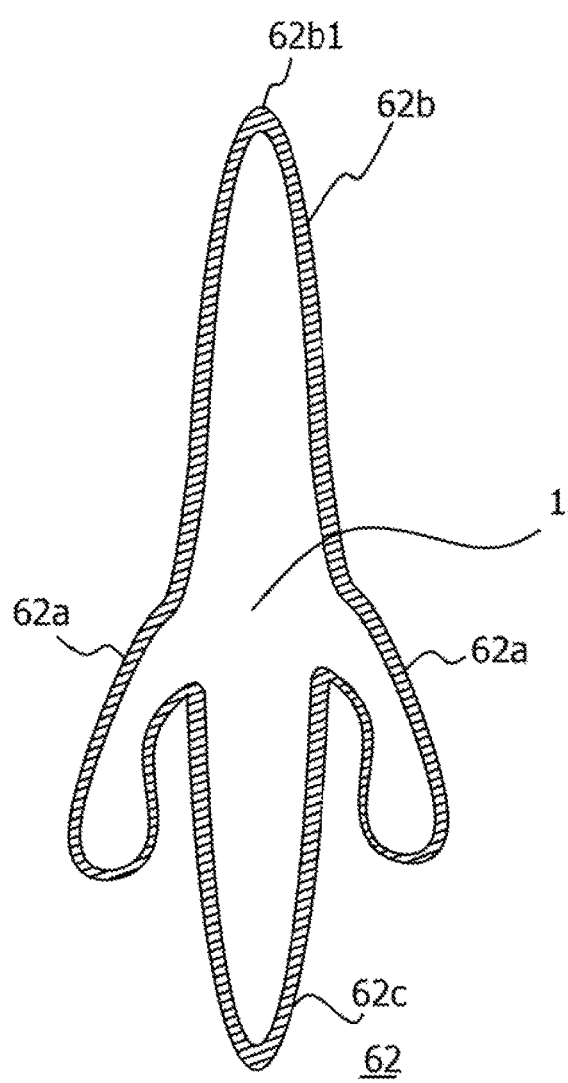
FIGS. 13A and 13B are sectional views of a tube according to still another modification.
Figure 13B:
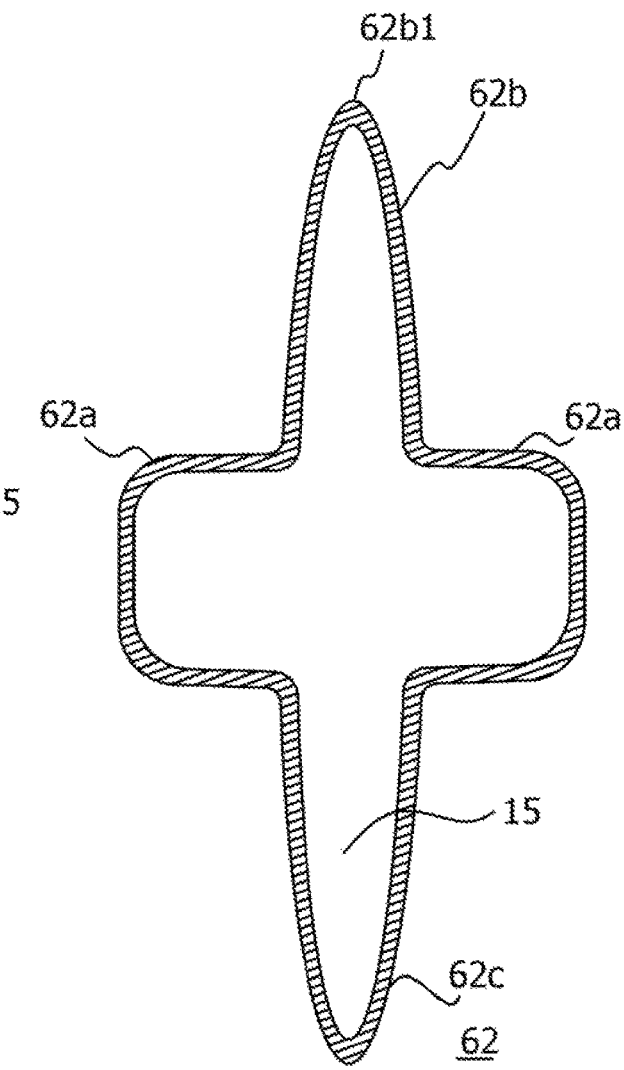

Referring to FIGS. 13A and 13B, a fourth modification is described. A tube 62 according to the fourth modification includes a bag-shaped portions 62a provided in side wall portions of the tube 62. The bag-shaped portions 62a each function as an expansion portion. Height maintaining portions 62b are formed above the bag-shaped portions 62a and height maintaining portions 62c are formed below the bag-shaped portions 62a. When the pump 42 is not operated or the pressure in the tube 62 is low, the bag-shaped portions 62a contract as illustrated in FIG. 13A. In contrast, when the pump 42 is operated and the pressure in the tube 62 increases, the bag-shaped portions 62a expand as illustrated in FIG. 13B When the bag-shaped portions 62a expand, the bag-shaped portions 62a are able to be brought into surface contact with the memories 52. The tube 62 as described above is mounted in the server 50 such that an upper end portion 62b1 of the tube 62 is located at a position lower than the upper end portions 52a of the memories 52, Thus, the memories may be cooled by the coolant liquid 15 in a region not higher than the memories 52.

Fifth Modification

Figure 14:
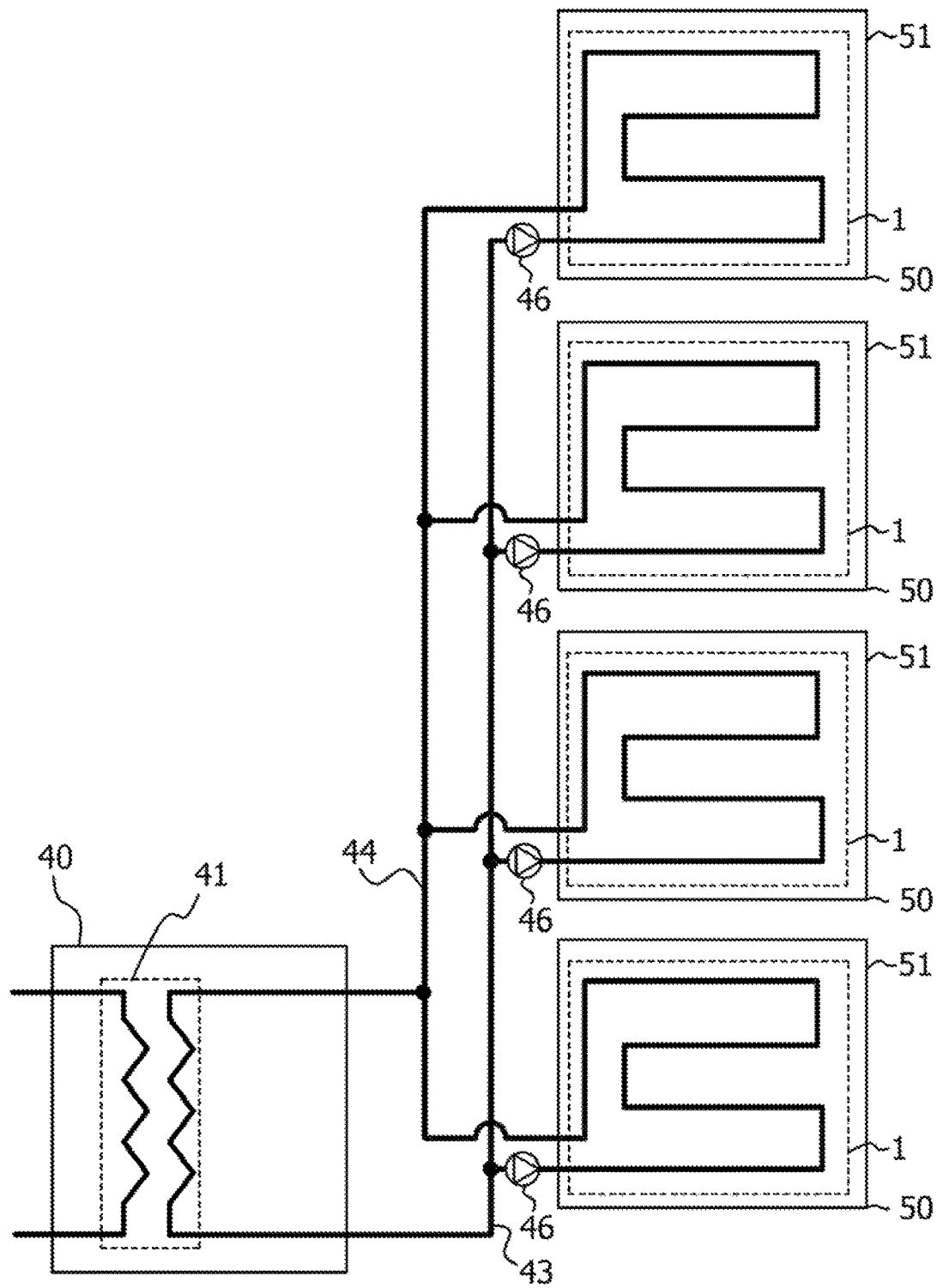
FIG. 14 is a schematic configuration view of an electronic apparatus in which servers are provided with respective pumps.

Next, referring to FIG. 14, a fifth modification is described. The difference between the electronic apparatus 100 illustrated in FIG. 1 and an electronic apparatus 200 according to the fifth modification illustrated in FIG. 14 is that, instead of the pump 42 provided in the electronic apparatus 100, a pump 46 is provided for each server 50 in the electronic apparatus 200.

Since the electronic apparatus 100 includes a single pump 42, the flow rate of the coolant liquid 15 introduced into the tubes 2 of the cooling modules 1 of the servers 50 is substantially uniform. Accordingly, the expansion amount of the expansion portions 2a provided in the tubes 2 is substantially the same. In contrast, in the electronic apparatus 200, the pump 46 is provided for each server 50. Thus, when output of the pump 46 is adjusted, the expansion amount of the expansion portions 2a is adjustable separately for each cooling module 1. Thus, a layout in which, for example, the pitch P of the memories 52 varies from one server 50 to another may be able to be appropriately dealt with.

Although the preferred embodiment according to the present disclosure has been described in detail above, the present disclosure is not limited to the embodiment, and various modifications and changes may be made within the scope of the gist of the present disclosure described in the claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electronic component cooling module comprising:
a tube disposed in parallel with an electronic component mounted on a board, in which a coolant liquid that cools the electronic component flows, and configured to include:
an expansion portion that expands, due to a pressure of the coolant liquid, toward the electronic component disposed beside the tube so as to be brought into surface contact with the electronic component, and
a height maintaining portion that maintains a dimension in a height direction; and
a supporter configured to support the tube,
wherein a height of the tube and a height of the supporter are equal to or smaller than a height of the electronic component in a state in which the electronic component is mounted on the board.

2. The electronic component cooling module according to claim 1,
wherein a thickness of the expansion portion is smaller than a thickness of the height maintaining portion.

3. The electronic component cooling module according to claim 1, wherein the expansion portion is formed between cover members mounted with one of the cover members over an upper end portion of the tube and another of the cover members mounted over a lower end portion of the tube.

4. The electronic component cooling module according to claim 1,
wherein the height maintaining portion includes a bellows-shaped portion configured to expand and contract in a direction toward the electronic component, and
wherein the expansion portion approaches and is separated from the electronic component as the bellows-shaped portion expands and contracts.

5. The electronic component cooling module according to claim 1,
wherein the expansion portion is a bag-shaped portion.

6. An electronic apparatus comprising:
an electronic component inserted into a slot mounted on a board;
a tube disposed in parallel with the electronic component, in which a coolant liquid that cools the electronic component flows, and configured to include:

an expansion portion that expands, due to a pressure of the coolant liquid, toward the electronic component disposed beside the tube so as to be brought into surface contact with the electronic component, and
a height maintaining portion that maintains a dimension in a height direction; and
a supporter configured to support the tube,
wherein a height of the tube and a height of the supporter are equal to or smaller than a height of the electronic component in a state in which the electronic component is mounted on the board.

7. The electronic apparatus according to claim 6, wherein a thickness of the expansion portion is smaller than a thickness of the height maintaining portion.

8. The electronic apparatus according to claim 6, wherein the expansion portion is formed between cover members mounted with one of the cover members over an upper end portion of the tube and another of the cover members mounted over a lower end portion of the tube.

9. The electronic apparatus according to claim 6, wherein the height maintaining portion includes a bellows-shaped portion configured to expand and contract in a direction toward the electronic component, and
wherein the expansion portion approaches and is separated from the electronic component as the bellows-shaped portion expands and contracts.

10. The electronic apparatus according to claim 6, wherein the expansion portion is a bag-shaped portion.

11. An electronic component cooling device comprising:
a board;
a plurality of supports mounted on the board;
a plurality of tubes supported by the supports and extending along a ongitudinal direction of the board;
at least one electronic component secured to the board and positioned between the plurality of tubes; and
a coolant provided within the plurality of tubes;
wherein the plurality of tubes comprising:
an expansion portion that expands toward the at least one electronic component due to pressure exerted by the coolant; and
a height maintaining portion that maintains a height of the plurality of tubes in a direction substantially perpendicular to the board.

12. The electronic component cooling device of claim 11, wherein the plurality of tubes are made of rubber.

13. The electronic component cooling device of claim 11, wherein a height of the plurality of tubes and a height of the plurality of supports are equal to or smaller than a height of the electronic component in a state in which the electronic component is mounted on the board.

14. The electronic component cooling device of claim 11, wherein a thickness of the expansion portion is less than a thickness of the height maintaining portion.

15. The electronic component cooling device of claim 11 further comprising:
a pump that circulates the coolant through the plurality of tubes.

16. The electronic component cooling device of claim 11, wherein the height maintaining portion comprises a bellows-shaped portion.

17. The electronic component cooling device of claim 11, wherein the plurality of tubes comprise first cover members mounted on first end portion of the plurality of tubes and second cover members mounted on second end portions of the plurality of tubes.

* * * * *